(12) United States Patent
Kang et al.

(10) Patent No.: US 9,438,199 B2
(45) Date of Patent: Sep. 6, 2016

(54) COMPONENT PACKAGE INCLUDING MATCHING CIRCUIT AND MATCHING METHOD THEREOF

(71) Applicant: Electronics and Telecommunications Research Institute, Daejeon (KR)

(72) Inventors: Dong Min Kang, Daejeon (KR); Seong Il Kim, Daejeon (KR); Sang Heung Lee, Daejeon (KR); Chull Won Ju, Daejeon (KR); Ho Kyun Ahn, Daejeon (KR); Hyung Sup Yoon, Daejeon (KR); Jong Won Lim, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 30 days.

(21) Appl. No.: 14/478,295

(22) Filed: Sep. 5, 2014

(65) Prior Publication Data

US 2015/0270822 A1 Sep. 24, 2015

(30) Foreign Application Priority Data

Mar. 18, 2014 (KR) .................. 10-2014-0031644

(51) Int. Cl.
*H03H 7/38* (2006.01)
*H01L 23/64* (2006.01)
*H01P 5/12* (2006.01)
(Continued)

(52) U.S. Cl.
CPC .............. *H03H 7/38* (2013.01); *H01L 23/642* (2013.01); *H01P 1/2039* (2013.01); *H01P 5/12* (2013.01); *H01L 2224/49175* (2013.01); *H05K 1/025* (2013.01); *H05K 2201/09781* (2013.01)

(58) Field of Classification Search
CPC ....... H03H 7/38; H01L 23/642; H01L 23/66; H01L 24/48; H01L 24/49
USPC .................................................. 333/17.3, 32
See application file for complete search history.

(56) References Cited

U.S. PATENT DOCUMENTS 6,094,108 A * 7/2000 Suematsu .............. H03H 11/32
327/257
7,553,092 B2 6/2009 Choi et al.
(Continued)

FOREIGN PATENT DOCUMENTS

KR 10-2006-0108907 A 10/2006
KR 10-0683164 B1 2/2007
(Continued)

*Primary Examiner* — Dean Takaoka
*Assistant Examiner* — Alan Wong
(74) *Attorney, Agent, or Firm* — Rabin & Berdo, P.C.

(57) ABSTRACT

Provided herein is a component package including a matching unit and a matching method thereof, the matching unit including: a substrate; a transmission line formed on the substrate, the transmission line being connected to a terminal of the component package; a bonding wire electrically connecting the transmission line and a central component; and a capacitor unit having a plurality of capacitors electrically connected with the transmission line by wiring connection, wherein an inductance of the matching unit is variable by adjusting a length of the bonding wire, and a capacitance of the matching unit is variable by increasing or reducing the number of capacitors electrically connected to the transmission line, of among the capacitors inside the capacitor unit, by extending or cutting off the wiring connection.

11 Claims, 6 Drawing Sheets

(51) Int. Cl.
  *H01P 1/203* (2006.01)
  *H05K 1/02* (2006.01)

(56) References Cited

U.S. PATENT DOCUMENTS

| | | | | |
|---|---|---|---|---|
| 7,777,571 B2 * | 8/2010 | Gotou | ................... | H01L 23/66 330/286 |
| 8,330,265 B2 * | 12/2012 | Farrell | ................ | H01L 23/642 257/690 |
| 8,345,434 B2 | 1/2013 | Takagi | | |
| 2011/0074006 A1 | 3/2011 | Wood et al. | | |
| 2011/0162798 A1 * | 7/2011 | Zhang | ............... | H01J 37/32183 156/345.28 |
| 2013/0015924 A1 * | 1/2013 | Andre | ................... | H01L 23/642 333/32 |

FOREIGN PATENT DOCUMENTS

| | | |
|---|---|---|
| KR | 10-2007-0024115 A | 3/2007 |
| KR | 10-2010-0032429 A | 3/2010 |
| KR | 10-2011-0020162 A | 3/2011 |

* cited by examiner

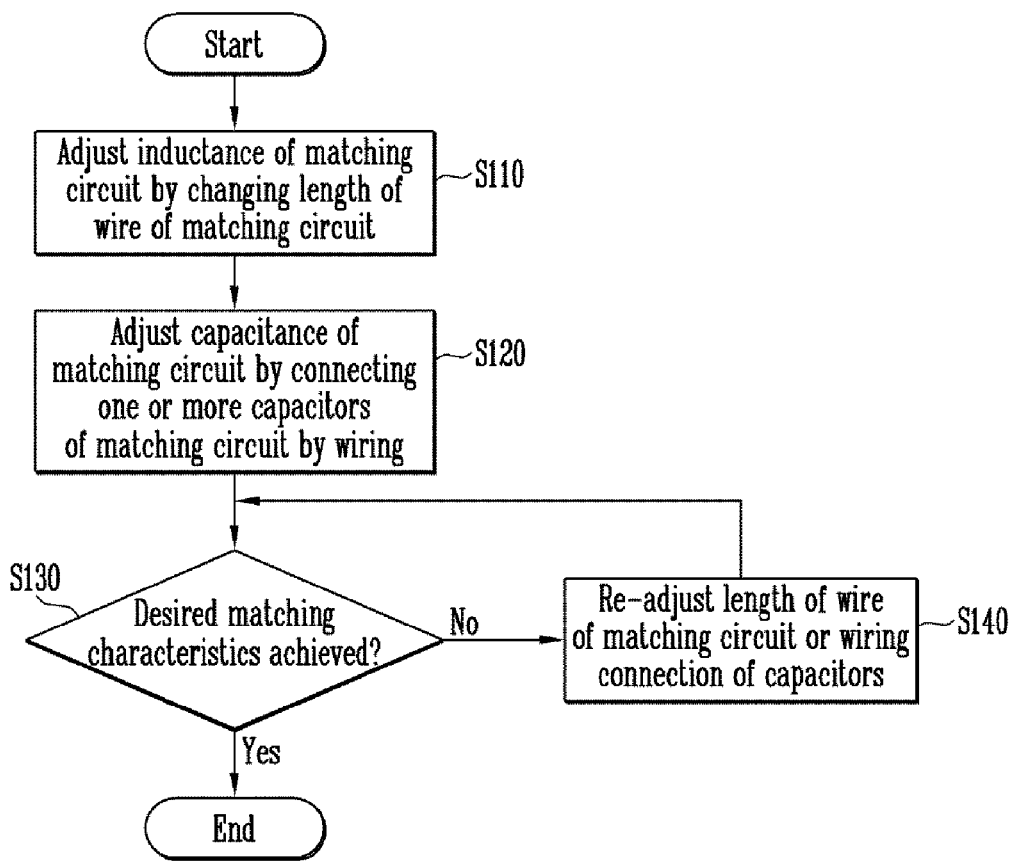

COMPONENT PACKAGE INCLUDING MATCHING CIRCUIT AND MATCHING METHOD THEREOF

CROSS-REFERENCE TO RELATED APPLICATION

This application claims the benefit of priority under 35 U.S.C. §119(a) of Korean Patent Application No. 10-2014-0031644, filed on Mar. 18, 2014, in the Korean Intellectual Property Office, the entire disclosure of which is incorporated herein by reference for all purposes.

BACKGROUND

1. Field

The following description relates to a component package, and more particularly to a component package including a matching circuit, and a matching method thereof. The present invention was derived from research conducted in an effort to develop convergence IT component material.

2. Description of Related Art

A component package (especially, an RF power component package) may include a matching circuit therein. There are two general methods for configuring a matching circuit therein.

FIG. 1 illustrates an example of a general method for configuring a matching circuit. Referring to FIG. 1, a power component package 10 forms an LC matching circuit with an input matching unit 12 disposed between a power component 11 in the center and an input terminal 18, and an output matching unit 13 disposed between the power component 11 in the center and an output terminal 19. Each of the matching units 12, 13 includes a substrate 12a, 13b, respectively, each including a transmission line 12b, 13b, respectively. And the matching units 12, 13 further include thin film capacitors 16, 17 disposed between the substrates 12a, 13a and the power component 11. Furthermore, each of the thin film capacitors 16, 17 is connected to the power component 11 by bonding wires 14, 15, respectively. In the LC matching circuit of FIG. 1, in order to perform a circuit matching between an input terminal 18 and output terminal 19, a capacitance (C) and inductance (L) parameters are adjusted by adjusting capacitances of the thin film capacitors 16, 17 and lengths of the bonding wires 14, 17.

FIG. 2 illustrates an example of another general method for configuring a matching circuit. Referring to FIG. 2, similarly to FIG. 1, a power component package 20 includes a power component 11, input terminal 28, output terminal 29, input matching unit 22, and output matching unit 23. However, in the power component package 20 of FIG. 2, each of the substrates 22a, 23a of the matching units 22, 23 is directly connected to the power component 11 by bonding wires 24, 25, respectively, and unlike in FIG. 1, a thin film capacitor is not included in the power component package 20. In FIG. 2, an impedance matching is performed by calculating beforehand an impedance transformer between an input transmission line 26 and an output transmission line 26, and then designing and manufacturing the substrates 22a, 23a to have a desired impedance transformer value.

The matching circuits of FIGS. 1 and 2 require a detailed and precise designing to be preceded based on a large signal modeling and small signal modeling of the power component package. That is, in the example of FIG. 1, it is necessary to design and manufacture an LC matching circuit by precisely modeling a power component package 10, and optimize matching characteristics by adjusting the C value of the thin film capacitors 16, 17 and the L value of the bonding wires 14, 15. However, performing such optimization is a very difficult task. In addition, in the example of FIG. 2, it is necessary to calculate the impedance transformer between the transmission lines 26, 27 very accurately, and then to design and manufacture the substrates 22a, 23a, or else, that is, if the calculation is not made accurately, it is difficult to achieve desirable matching characteristics.

Furthermore, in the matching circuits of FIGS. 1 and 2, there is a burden of having to re-design the matching circuits, should any difference is made to the power components 11, 21.

SUMMARY

Therefore, a purpose of the exemplary embodiments is to provide a component package wherein a matching circuit can be configured easily and a matching method thereof.

Another purpose of the exemplary embodiments is to provide a component package wherein optimization of matching characteristics can be performed effectively even when a different component is inserted, and a matching method thereof.

In one general aspect, there is provided a component package including a matching unit, the matching unit including: a substrate; a transmission line formed on the substrate, the transmission line being connected to a terminal of the component package; a bonding wire electrically connecting the transmission line and a central component; and a capacitor unit having a plurality of capacitors electrically connected with the transmission line by wiring connection, wherein an inductance of the matching unit is variable by adjusting a length of the bonding wire, and a capacitance of the matching unit is variable by increasing or reducing the number of capacitors electrically connected to the transmission line, of among the capacitors inside the capacitor unit, by extending or cutting off the wiring connection.

In the general aspect of the component package, the adjusting a length of the bonding wire may be performed by increasing or reducing a width of the substrate and extending or shortening the bonding wire so that the transmission line is still electrically connected to the central component despite the increasing or reducing of the width of the substrate.

In the general aspect of the component package, the capacitor unit may be formed on the substrate and comprise a plurality of subordinate capacitor units having one or more capacitors.

In the general aspect of the component package, the terminal may be an input terminal of the component package, and the matching unit may be an input matching unit disposed between the input terminal and the central component In the general aspect of the component package, the terminal may be an output terminal of the component package, and the matching unit may be an output matching unit disposed between the output terminal and the central component.

In the general aspect of the component package, the plurality of capacitors may be connected to the transmission line by wiring connection, the capacitors being in series or parallel to one another.

In the general aspect of the component package, the central component may be a power component used for generating, transmitting, converting and controlling power.

In the general aspect of the component package, the central component may be a GaN power component.

In another general aspect, there is provided a matching method of a component package including a central component, matching circuit, and a terminal connected to the matching circuit, the method including: adjusting an inductance of the matching circuit by adjusting a length of a bonding wire electrically connecting a substrate where a transmission line of the matching circuit is formed with the central component; and extending or reducing a wiring connection between the transmission line and the capacitors or a wiring connection between the capacitors, in order to adjust the number of capacitors formed on the substrate of the matching circuit and electrically connected to the transmission line.

In the general aspect of the matching method of a component package, there is further provided determining whether or not desired matching characteristics have been achieved for the matching circuit; and re-adjusting a length of the bonding wire, or re-extending or re-reducing the extended or reduced wiring connection, according to a result of the determining.

In the general aspect of the matching method of a component package, the transmission line may be formed on the substrate and is electrically connected to the terminal, and the bonding wire may electrically connect the transmission line and the central component.

According to the exemplary embodiments of the present disclosure, it is possible to configure a matching circuit even if a detailed designing operation has not been preceded, thereby being capable of easily configuring a matching circuit of a component package.

Furthermore, it is possible to adjust a capacitance value and inductance value of a matching circuit easily even if a different component is inserted, thereby being capable of performing optimization of matching characteristics according to any changes in the component.

Other features and aspects may be apparent from the following detailed description, the drawings, and the claims.

BRIEF DESCRIPTION OF THE DRAWINGS

FIG. 7 is a flowchart of a matching method of a component package, according to an exemplary embodiment of the present disclosure.

Figure 1:
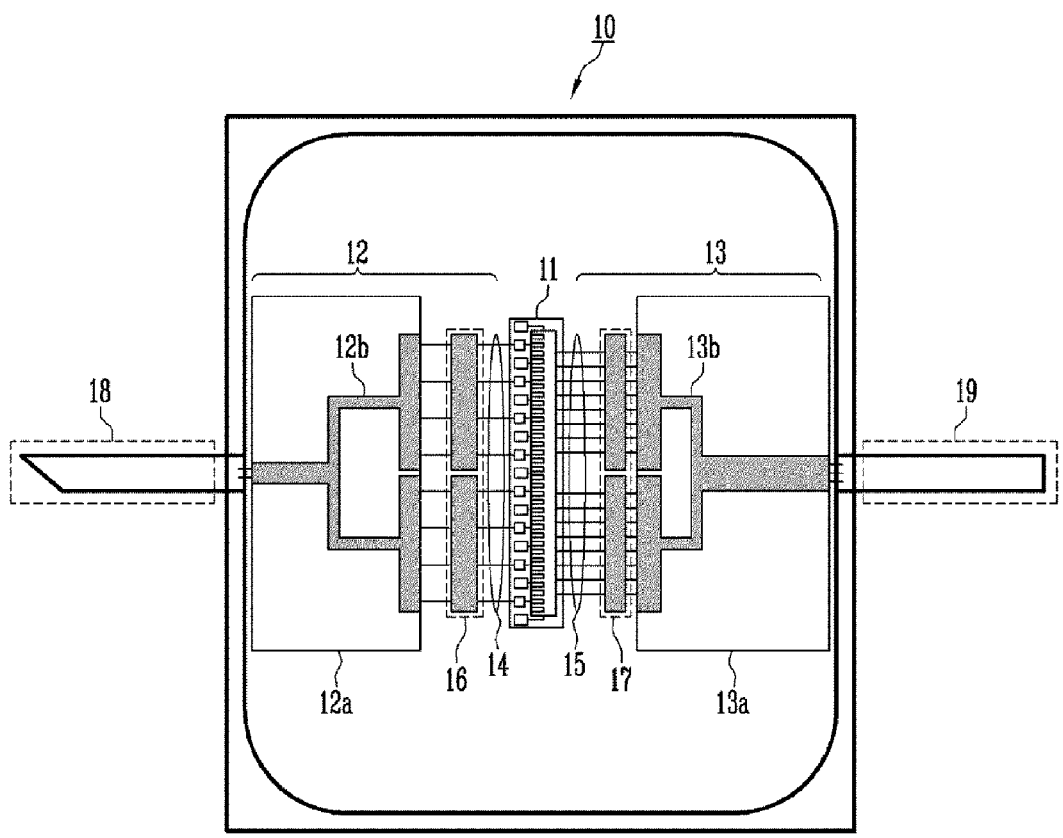
FIG. 1 is a plane view of an example of a general matching circuit configuration.
Figure 2:
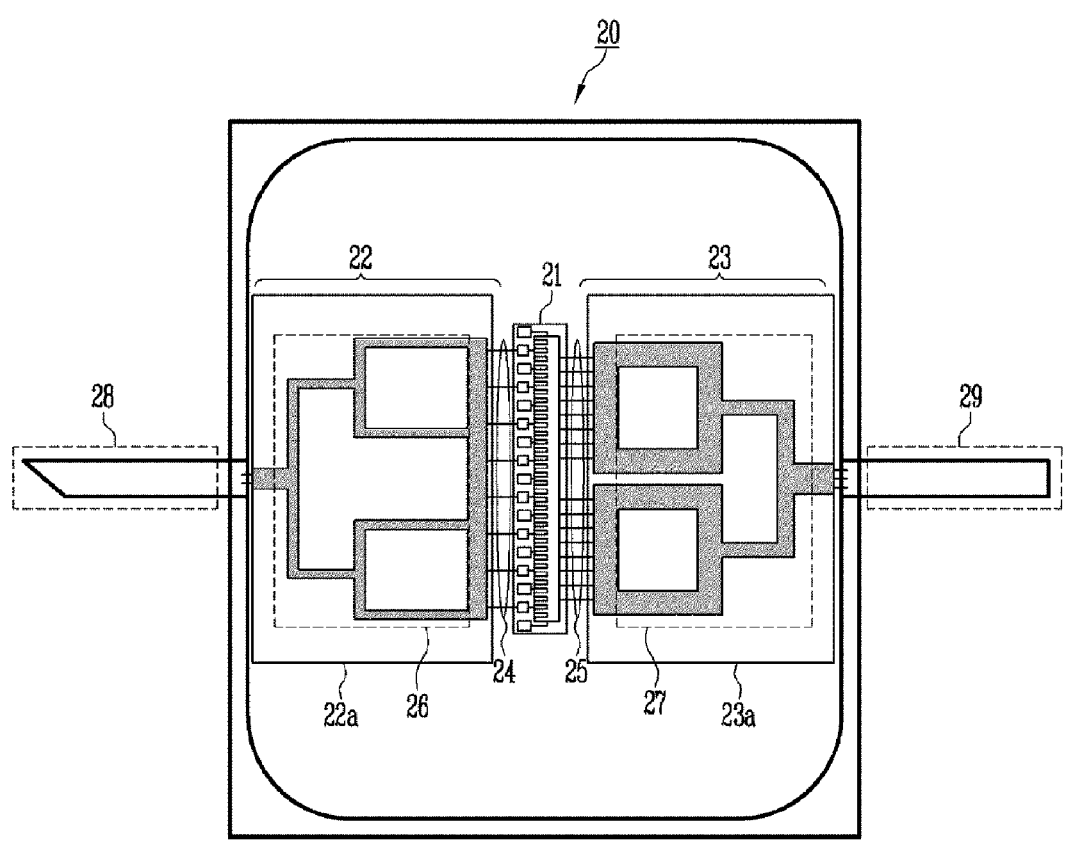
FIG. 2 is a plane view of another of a general matching circuit configuration.

Throughout the drawings and the detailed description, unless otherwise described, the same drawing reference numerals will be understood to refer to the same elements, features, and structures. The relative size and depiction of these elements may be exaggerated for clarity, illustrating, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Meanwhile, in the following description, a component package is a power component package including, but is not limited to, a power component (especially, an RF power component package). For example, the component package may be a communication component package that includes a communication component instead of a power component. The type of component to be inserted may change according to usage of the component package.

The details and concept of the present disclosure according to exemplary embodiments are explained hereinbelow with reference to the attached drawings.

Figure 3:
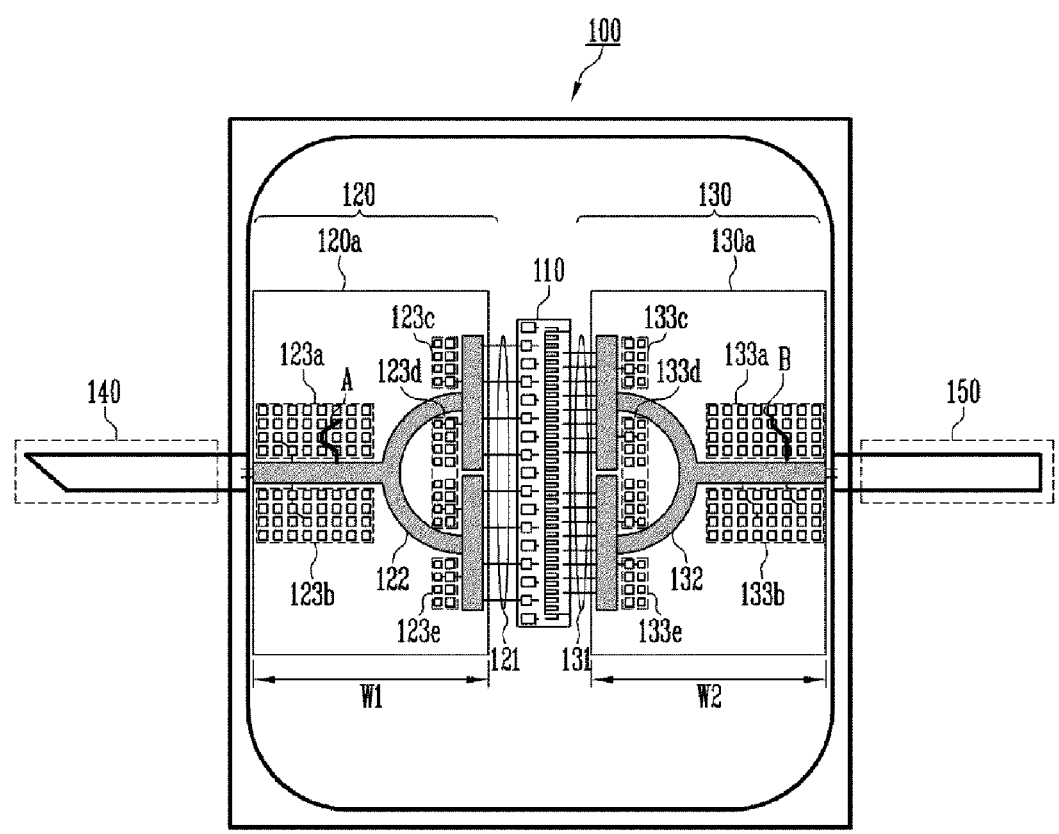
FIG. 3 is a plane view of a component package including a matching circuit, according to an exemplary embodiment of the present disclosure.

FIG. 3 is a plane view illustrating a component package including a matching circuit, according to an exemplary embodiment of the present disclosure. With reference to FIG. 3, the component package 100 includes a central power component 110, input terminal 140, output terminal 150, input matching unit 120 disposed between the power component 110 and the input terminal 140, and output matching unit 130 disposed between the power component 110 and the output terminal 150. In FIG. 3, the matching circuit of the component package 100 refers to an electric circuit including the input matching unit 120, output matching unit 130 or an electric connecting relationship therebetween.

The power component 110 may be a component used in generating, transmitting, converting or controlling power, for example, an RF power component. In an exemplary embodiment, the power component 110 may be a GaN power component.

Regarding the component package 100, the power component 110 and the input terminal 140 and output terminal 150 that are electrically connected to the power component 110 are obvious techniques to those skilled in the art, and the related detailed configuration is well known in the related art, and thus explanation on the power component 110, the input terminal 140 and output terminal 150 is omitted. However, the configuration of the matching units 120, 130 for adjusting matching characteristics of the component package 100 and the functions thereof will be the main focus in the following explanation.

The input matching unit 120 includes a substrate 120a and one or more bonding wire 121 connecting the substrate 120a and the power component 110. The bonding wire 121 is electrically connected to a transmission line 122 inside the substrate 120a.

The substrate 120a includes the transmission line 122 electrically connected to the bonding wire 121 and input terminal 140, and a matching capacitor unit disposed around the transmission line 122. The matching capacitor unit includes a plurality of subordinate matching capacitor units 123a, 123b, 123c, 123d, 123e having one or more capacitor. The substrate 120a may be configured such that a transmission line 122 or matching capacitor units 123a, 123b, 123c, 123d, 123e are formed on a substrate material (for example, ceramic) or such that a transmission line 122 or matching capacitor units 123a, 123b, 123c, 123d, 123e are embedded inside a substrate material. A width W1 of the substrate 120a may be designed or manufactured to be of a predetermined value, but may also be adjusted afterwards.

One or more matching capacitor units 123a, 123b, 123c, 123d, 123e are disposed around the transmission line 122, each of which includes at least one matching capacitor. In an exemplary embodiment, each of the matching capacitor units 123a, 123b, 123c, 123d, 123e may include a plurality of matching capacitors disposed in a matrix format. The matching capacitors of each of the matching capacitor units 123a, 123b, 123c, 123d, 123e may be electrically connected to the transmission line 122 by wiring. For example, in a first matching capacitor unit 123a, four capacitors are connected to the transmission line 122 by wiring in parallel or series to one another.

The output matching unit 130 includes a substrate 130a and one or more bonding wire 131 connecting the substrate 130a and the power component 110. The bonding wire 131 is electrically connected to a transmission line 132 inside the substrate 130a.

The output matching unit 130 is configured to have a same or similar configuration as the input matching unit 120. For example, the substrate 130a may include the transmission line 132 electrically connected to the bonding wire 131 and input terminal 130, and one or more matching capacitor units 133a, 133b, 133c, 133d, 133e disposed around the transmission line 132, each of which includes at least one matching capacitor (for example, disposed in a matrix format).

Likewise, the matching capacitors of each matching capacitor unit 133a, 133b, 133c, 133d, 133e are configured to be electrically connected to the transmission line 132 by wiring. For example, in the sixth matching capacitor unit 133a, four capacitors are connected to the transmission line 132 by the wiring B in parallel or in series to one another.

Furthermore, a width W2 of the substrate 130a may be designed or manufactured to be of a predetermined value, but may also be adjusted afterwards. However, the width W2 of the substrate 130a may be designed, manufactured, or adjusted to have a different value than the width W1 of the substrate 120a of the input matching unit 120.

Meanwhile, matching characteristics of a circuit is achieved by adjusting capacitance and inductance values of a matching circuit (or an input terminal circuit or output terminal circuit) to desired values. According to a configuration of the present disclosure illustrated in FIG. 3, matching characteristics of a component package 100 may be adjusted or optimized in a far more easily and improved method than the methods of related art.

First of all, in the component package 100, in order to adjust an inductance value of the input or output matching units 120, 130, a length between the substrate 120a and the power component 110, and a length between the substrate 130a and the power component 110 are adjusted. For example, by increasing a length of the bonding wire 121, 131, it is possible to increase the inductance values of the input or output matching unit 120, 130. On the contrary, by reducing the length of the bonding wire 121, 131, it is possible to reduce the inductance value of the input or output matching unit 120, 130.

In an exemplary embodiment, in order to increase the length of the bonding wire 121, 131, it is possible to reduce the width W1, W2 of the substrate 120a, 130a of the component package 100 towards an end (that is, in the direction towards the input terminal 140 or output terminal 150), and extend the length of the bonding wire 121, 131 as much as a distance between the power component 110 and the substrate 120a, 130a that has been increased by the aforementioned reduction of width.

In an exemplary embodiment, in order to reduce the length of the bonding wire 121, 131, it is possible to increase the width W1, W2 of the substrate 120a, 130a of the component package 100 towards a center (that is, in the direction towards the power component 110), and shorten the length of the bonding wire 121, 131 as much as a distance between the power component 110 and the substrate 120a, 130a that has been reduced by the aforementioned increase of width.

As such, adjusting a length of the bonding wire 121, 131 may be performed very easily, and thus an inductance value of the component package 100 may be adjusted easily. Meanwhile, examples of adjusting a length of the bonding wire 121, 131 will be explained again with reference to FIG. 4 hereinafter.

Next, in the component package 100, in order to adjust a capacitance value of the input or output matching unit 120, 130, a wiring connection between capacitors of one or more capacitor units 123a, 123b, 123c, 123d, 123e or 133a, 133b, 133c, 133d, 133e and the transmission line 122, 132 is adjusted. That is, by connecting the capacitors included in the capacitor units 123a, 123b, 123c, 123d, 123e or 133a, 133b, 133c, 133d, 133e to the transmission line 122, 133 by wiring or by cutting off a wiring connection between the capacitors included in the capacitor units 123a, 123b, 123c, 123d, 123e or 133a, 133b, 133c, 133d, 133e and the transmission line 122, 133, it is possible to increase or reduce a capacitance value of the input or output matching unit 120, 130.

Furthermore, since each of the capacitor units 123a, 123b, 123c, 123d, 123e or 133a, 133b, 133c, 133d, 133e may include a plurality of capacitors, it is possible to freely adjust a size of increase or reduction of a capacitance value by extending a wiring connection from the transmission line 122, 133 (so that the wiring connection from the transmission line 122, 133 can be further extended to other capacitors) or by cutting a pre-connected wiring connection at an appropriate position (so that the number of capacitors electrically connected to the wiring is reduced).

In addition, since each of the capacitors 123a, 123b, 123c, 123d, 123e or 133a, 133b, 133c, 133d, 133e may be disposed in different positions inside the substrate 120a, 130a, and be connected by wiring with different points on the transmission line 122, 132 or with different components (not illustrated) inside the substrate 120a, 130a, it is possible to adjust matching characteristics of the matching units 120, 130 with more precision, when necessary.

As such, adjusting a capacitance value of the input matching unit 120 and output matching unit 130 may be achieved merely by connecting capacitors by wiring or by cutting off a wiring connection, and thus it is far more convenient and easy compared to techniques of related art.

Furthermore, in related art inventions, when a different central component 110 was to be inserted, there was a burden of having to re-design the matching circuit, but according to the present disclosure, it is possible to achieve optimization of matching characteristics simply by adjusting a length of the bonding wire 121, 131 or adjusting the wiring connection of the capacitor units 123a, 123b, 123c, 123d, 123e or 133a, 133b, 133c, 133d, 133e.

Meanwhile, the aforementioned were just examples of the present disclosure. And thus, an input matching unit 120 or output matching unit 130 of a component package 100 may be configured differently from FIG. 3. For example, a component package 100 may have an input matching unit 120 configured as in FIG. 3, and an output matching unit 130 configured as in related art (for example, 13 in FIG. 1). On the contrary, a component package 100 may have an input matching unit 120 configured as in related art (for example, 12 of FIG. 1) and an output matching unit 130 configured as in FIG. 3.

Furthermore, an input matching unit 120 or output matching unit 130 does not have to include a plurality of matching capacitor units 123a, 123b, 123c, 123d, 123e or 133a, 133b, 133c, 133d, 133e as illustrated in FIG. 3. For example, an input matching unit 120 or output matching unit 130 may each include some of the matching capacitor units 123a, 123b, 123c, 123d, 123e or 133a, 133b, 133c, 133d, 133e, or even just one matching capacitor unit 123a, 133a.

Furthermore, it was explained above that an inductance value of an input or output matching unit 120, 130 is adjusted first, then followed by adjusting a capacitance thereof, but this is just an example, and thus there is no limitation thereto. For example, a capacitance value may be adjusted prior to an inductance value, or they may be adjusted at the same time.

According to the aforementioned configuration of a matching circuit of the present disclosure, it is possible to configure a matching circuit obviating the need for designing in detail and precision beforehand. In addition, even when a different component is inserted, it is possible to easily adjust a capacitance value and inductance value of a matching circuit, thereby enabling easy and effective optimization of matching characteristics required by a change in power component.

Figure 4:
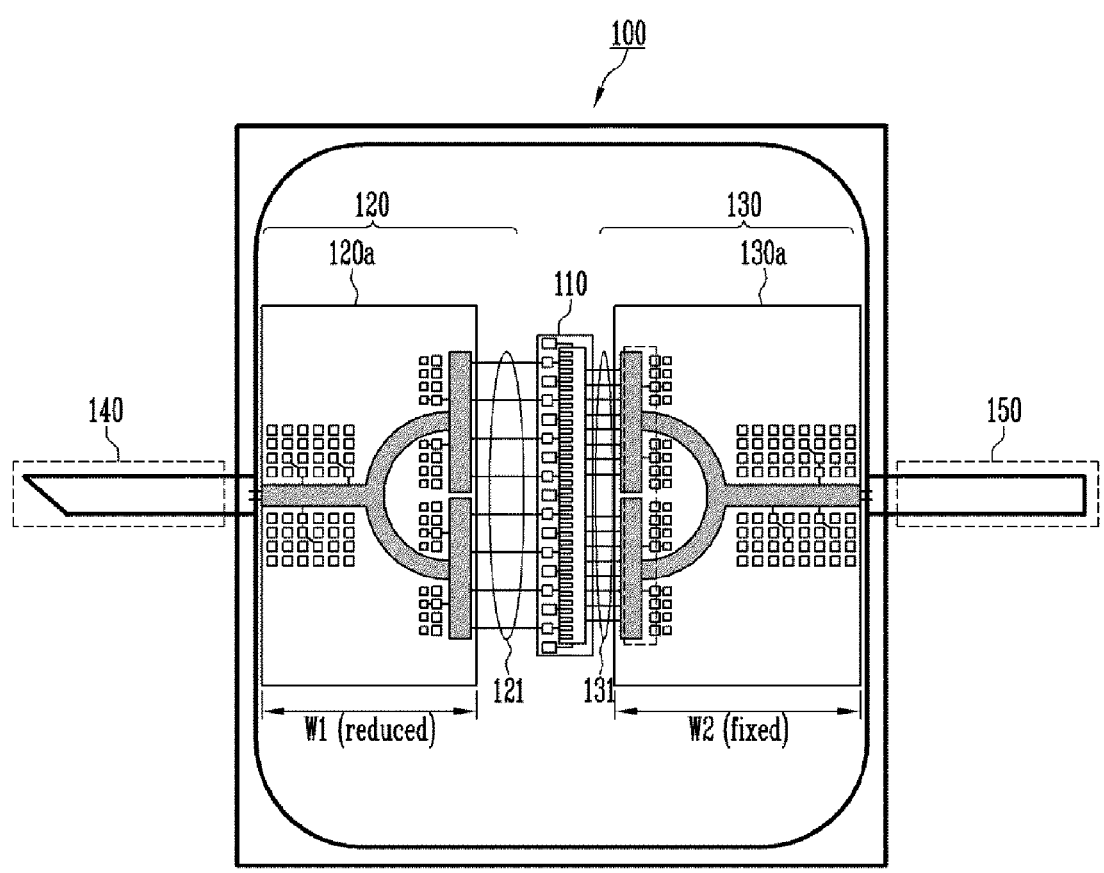
FIG. 4 is a plane view of a method for adjusting an inductance value of a matching circuit, according to an exemplary embodiment of the present disclosure.

FIG. 4 is a plane view of a method for adjusting an inductance value of a matching circuit, according to an exemplary embodiment of the present disclosure. Referring to FIG. 4, a component package 100 includes a power component 110, input matching unit 120, output matching unit 130, input terminal 140, and output terminal 150. The component package 100 of FIG. 4 is the same as the component package illustrated in FIG. 3, except that in the component package 100 of FIG. 4, the width W1 of the substrate 120a has been reduced in order to adjust an inductance value of the input matching unit 120.

The configurative elements of FIG. 4 are the same as those of FIG. 3, and thus detailed explanation is omitted.

FIG. 4 illustrates an example of increasing a length of a bonding wire 121 (that is, increase of an inductance value) of an input matching unit 120 for optimization of matching characteristics of a component package 100. In order to increase a length of a bonding wire 121, first of all, a width W1 of the substrate 120a of the input matching unit 120 is reduced. Herein, only the bonding wire 121 of the input matching unit 120 is adjusted, while a width W2 of the substrate 130a of the output matching unit 130 is fixed.

When the width W1 of the substrate 120a is reduced, a distance between the substrate 120a and the power component 110 increases as much as the reduction of the substrate 120a. In addition, by extending the length of the bonding wire 121 between the substrate 120a and the power component 110, the length of the bonding wire 121 of the input matching unit 120 increases. Consequently, by the increase of length of the bonding wire 121, the inductance value of the input matching unit 120 is adjusted (for example, increase of inductance value), and the matching characteristics of the component package 100 are adjusted and optimized.

Meanwhile, FIG. 4 illustrates adjusting a width W1 of the input matching unit 120 and a length of the bonding wire 121, but there is no limitation thereto. For example, according to an exemplary embodiment, it is possible to adjust a width W2 of an output matching unit 130 instead of a width of an input matching unit 120, and adjust a length of a bonding wire 131 to achieve matching characteristics of a component package 100. And according to another exemplary embodiment, it is possible to adjust both widths W1, W2 of an input matching unit 120 and output matching unit 130, and a length of a bonding wire 121, 131, to achieve matching characteristics of the component package 100.

According to such a configuration illustrated in FIG. 4, it is possible to easily and freely adjust an inductance value of a matching circuit.

Figure 5:
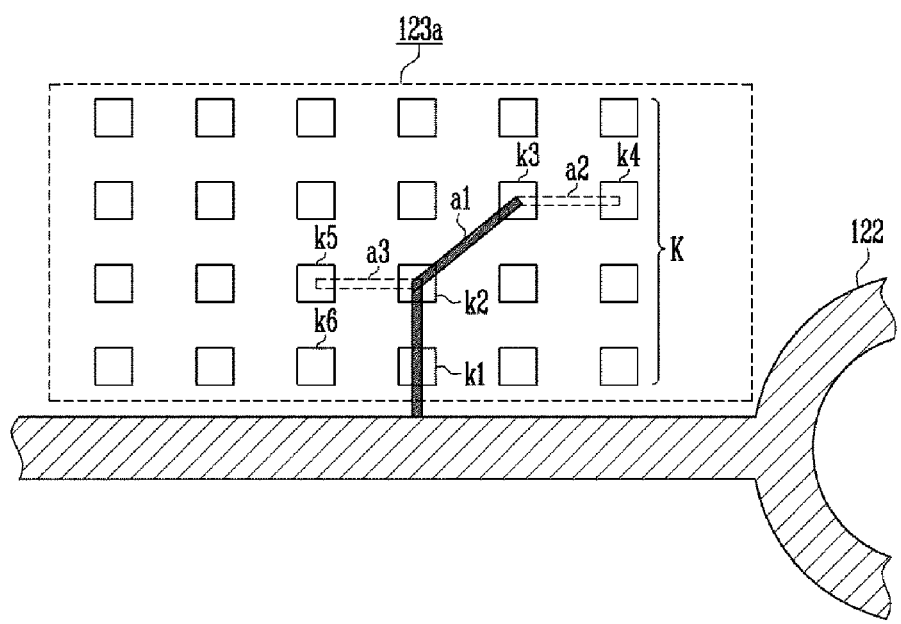
FIG. 5 is a plane view of a method for adjusting a capacitance value of a matching circuit, according to an exemplary embodiment of the present disclosure.

FIG. 5 is a plane view of a method for adjusting a capacitance value of a matching circuit, according to an exemplary embodiment of the present disclosure. FIG. 5 illustrates an example of a first matching capacitor unit 123a of among the matching capacitors 123a, 123b, 123c, 123d, 123e or 133a, 133b, 133c, 133d, 133e illustrated in FIG. 3 and a transmission line 122 disposed around the first matching capacitor unit 123a.

The first matching capacitor unit 123a includes one or more capacitor. For example, the first matching capacitor unit 123a may include a plurality of capacitors K disposed in a matrix format of 4×6.

In order to adjust matching characteristics of a component package 100, in FIG. 5, a capacitance value of a transmission line 122 or input matching unit 120 is adjusted. More specifically, by electrically connecting one or more capacitor k1, k2, k3 of the first matching capacitor unit 123a with the transmission line 122 by wiring connection a1, a capacitance value of the transmission line 122 would be changed or a capacitance value of an input matching unit 120 would be changed due to the change of the capacitance value of the transmission line 122.

For example, in a case where capacitors k1, k2, k3 of FIG. 5 are each connected to the transmission line in parallel to one another, the capacitance value of the transmission line 122 will increase by wiring connection a1. On the contrary, in a case where the capacitors k1, k2, k3 are each connected to the transmission line in series to one another, the capacitance value of the transmission line 122 will be reduced by the wiring connection a1.

In a case where desired matching characteristics have not been obtained even by wiring connection a1, it is possible to re-adjust the matching characteristics by additionally extending the wiring connection a1 or cutting of a portion of the wiring connection. For example, in a case where the wiring connection a1 is extended to capacitor k4 along a virtual wiring a2, a capacitance value of the capacitor k4 would affect an overall equivalent capacitance value of the matching circuit, and thus making it possible to further adjust the matching characteristics of the component package 100.

In addition, extension of the wiring does not have to start from an end of the wiring connection a1. For example, the wiring connection a1 may be extended along the virtual wiring a3 that extends from a middle node of the wiring connection a1 (that is, from capacitor k2 to capacitor k5).

Not all capacitors of the first matching capacitor unit 123a have to be connected to the transmission line 122. For example, capacitor k6 may not be connected to any of the transmission line 122 or other capacitors k1, k2, k3, k4, k5, and instead be left alone.

Meanwhile, only the method for adjusting a capacitance of the first matching capacitor 123a unit of among the matching capacitor units 123a, 123b, 123c, 123d, 123e or 133a, 133b, 133c, 133d, 133e illustrated in FIG. 3 was explained above, but there is no limitation thereto. For example, in another exemplary embodiment of the present disclosure, it is possible to achieve desired matching characteristics of a component package 100 by adjusting a capacitance of at least one of other capacitor units 123*b*, 123*c*, 123*d*, 123*e* or 133*a*, 133*b*, 133*c*, 133*d*, 133*e*, together with adjusting a capacitance of the first matching capacitor unit 123*a*.

According to a configuration of FIG. 5, it is possible to easily and freely adjust a capacitance value of a matching circuit.

Figure 6:
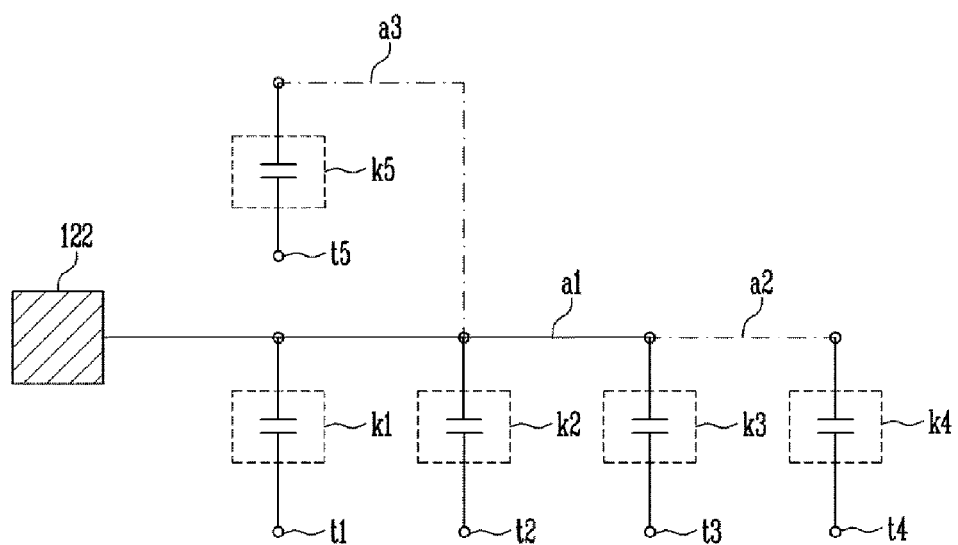
FIG. 6 is a circuit diagram equivalently illustrating how the capacitors of FIG. 5 are connected.

FIG. 6 is a circuit diagram equivalently illustrating how the capacitors in FIG. 5 are connected. FIG. 6 illustrates in a circuit diagram of an electrical connection relationship between the capacitors k1, k2, k3, k4, k5 illustrated in FIG. 5 and the transmission line 122.

Each of the capacitors k1, k2, k3, k4, k5 is illustrated in circuit symbols of a capacitor. One terminal of each of the capacitors k1, k2, k3, k4, k5 is either connected to an electric wiring a1 extended from the transmission line 122 or to a virtual wiring a2, a3 extendable from the electric wiring a1. The other terminal of each of the capacitors k1, k2, k3, k4, k5 is connected to any one of the nodes t1, t2, t3, t4, t5. In an exemplary embodiment, the other nodes t1, t2, t3, t4, t5 may be connected to any one of the electric nodes existing on or inside the substrate 120*a*.

In FIG. 6, an assumption is made that each of the capacitors k1, k2, k3, k4, k5 is connected to the transmission line 122 in parallel to one another. However, this is just an example, and thus in other exemplary embodiments, each of the capacitors k1, k2, k3, k4, k5 may be connected to the transmission line 122 by wiring connection in series to one another, unlike in FIG. 6.

In FIG. 6, three capacitors k1, k2, k3 are connected to the wiring connection extended from the transmission line 122, each capacitor being in parallel to one another. Furthermore, in a case where additional virtual wiring a2, a3 is connected, other capacitors k4, k5 may be connected to the transmission line 122, the capacitors being parallel to one another. Such additional parallel connection due to extension of wiring increases a capacitance value of the input matching unit 120. Therefore, it is possible to adjust matching characteristics of a component package 100 by adjusting the number of capacitors additionally connected by wiring.

FIG. 7 is a flowchart of a matching method of a component package, according to an exemplary embodiment of the present disclosure. Referring to FIG. 7, a matching method of a component package includes operations S110 to S140.

At operation S110, by changing a length of a bonding wire of a matching circuit of a component package 100, an inductance of the matching circuit is adjusted. Herein, the matching circuit of the component package 100 refers to an electric circuit including the input matching unit 120, output matching unit 130 or an electric connecting relationship therebetween.

The specific method of changing a length of a bonding wire of the matching circuit is the same as in FIGS. 3 to 4.

At operation S120, a capacitance of the matching circuit is adjusted by connecting one or more capacitor formed in the matching circuit of the component package 100 by wiring. In an exemplary embodiment, one or more capacitors may be grouped to form a plurality of capacitor units. In an exemplary embodiment, one or more capacitors may be connected to a transmission line 122 or 132 of the matching circuit by wiring, or connected to other capacitors by wiring, or connected to other components on the matching circuit by wiring.

The specific method of adjusting a capacitance of the matching circuit is the same as in FIGS. 3, 5, and 6.

At operation S130, a determination is made whether or not desired matching characteristics of the component package 100 have been achieved. If so, the matching method of the component package ends, but if not, the matching method of the component package proceeds to operation S140.

At operation S140, the matching characteristics are re-adjusted by re-adjusting a length of a bonding wire of the matching circuit of the component package 100, or by changing a wiring connection of the capacitors (for example, extending or cutting off the wiring connection). In addition, it is returned to operation S130 to determine whether or not the desired matching characteristics have been achieved. Furthermore, operation S130 and operation 140 are conducted repeatedly until the desired matching characteristics are achieved, and if it is determined in operation S130 that the desired matching characteristics have been achieved, the matching method of the component package finally ends.

Meanwhile, it was explained above referring to FIG. 7 that an inductance value of a matching circuit is adjusted first and then a capacitance value of the matching circuit is adjusted thereafter, but there is no limitation thereto, as mentioned in FIG. 3.

According to the aforementioned circuit matching method of the present disclosure, it is possible to configure a matching circuit even if a detailed designing operation has not been preceded, thereby being capable of easily configuring a matching circuit of a component package. Furthermore, even when a different component is inserted, it is possible to easily adjust a capacitance value and inductance value of the matching circuit, thereby enabling easy and effective optimization of matching characteristics when there has been a change of component.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A component package, comprising:
    a central component;
    external terminals provided in both sides of the component package,
    a matching unit including
        a substrate disposed inside the component package between the central component and one of the external terminals,
        a transmission line formed on the substrate, a first side of the transmission line being connected to said one of the external terminals of the component package,
        bonding wires electrically connecting the transmission line and the central component such that first ends of the bonding wires are connected to the central component and second ends of the bonding wires are commonly connected to a second side of the transmission line,
        a capacitor unit including a plurality of capacitors arranged in a matrix format within the substrate, the capacitor unit being spaced apart from the transmission line and the bonding wires, and
        a wiring connector separated from the bonding wires and electrically connecting at least one of the capacitors to the transmission line to form a capacitance commonly applied to the bonding wires, wherein an inductance of the matching unit is defined by a length of the bonding wires, and the capacitance of the matching unit is defined by the number of the capacitors connected to the transmission line by the wiring connector.

2. The component package according to claim 1, wherein the length of the bonding wires is adjusted by increasing or reducing a width of the substrate.

3. The component package according to claim 1, wherein the matching unit includes more than one capacitor unit and more than one wiring connector.

4. The component package according to claim 1, wherein said one of the external terminals is an input terminal of the component package, and
the matching unit is an input matching unit disposed between the input terminal and the central component.

5. The component package according to claim 1, wherein said one of the external terminals is an output terminal of the component package, and
the matching unit is an output matching unit disposed between the output terminal and the central component.

6. The component package according to claim 1, wherein said at least one of the capacitors are connected in series or parallel to the transmission line by the wiring connector.

7. The component package according to claim 1, wherein the central component is a power component used for generating, transmitting, converting and controlling power.

8. The component package according to claim 7, wherein the central component is a GaN power component.

9. The component package according to claim 1, wherein the external terminals include
an input terminal, and
an output terminal, and
the component package includes
a first matching unit disposed between the input terminal and the central component, and
a second matching unit between the output terminal and the central component.

10. A matching method of a component package including
a central component,
external terminals provided in both sides of the component package,
a matching unit including
a substrate disposed inside the component package between the central component and one of the external terminals,
a transmission line formed on the substrate, a first side of the transmission line being connected to said one of the external terminals of the component package,
bonding wires electrically connecting the transmission line and the central component such that first ends of the bonding wires are connected to the central component and second ends of the bonding wires are connected to the transmission line,
a capacitor unit including a plurality of capacitors arranged in a matrix format within the substrate, the capacitor unit being spaced apart from the transmission line and the bonding wires, and
a wiring connector separated from the bonding wires and electrically connecting at least one of the capacitors to the transmission line to form a capacitance commonly applied to the bonding wires,
the method comprising:
adjusting an inductance of the matching unit by adjusting a length of the bonding wires electrically connecting the transmission line with the central component; and
adjusting the capacitance by increasing or decreasing in a length of the wiring connector connected between the transmission line and the capacitors or between the capacitors in order to adjust the number of the capacitors electrically connected to the transmission line.

11. The method according to claim 10, further comprising determining whether or not desired matching characteristics have been achieved; and
repeating said adjusting the inductance and the capacitance, according to a result of the determining.

* * * * *